United States Patent [19]

Green, Jr. et al.

[11] Patent Number: 4,532,477

[45] Date of Patent: Jul. 30, 1985

[54] DISTORTION COMPENSATION FOR A MICROWAVE AMPLIFIER

[75] Inventors: Donald R. Green, Jr., North Andover, Mass.; James P. Moffatt, Salem, N.H.

[73] Assignee: AT&T Bell Laboratories, Murray Hill, N.J.

[21] Appl. No.: 565,185

[22] Filed: Dec. 23, 1983

[51] Int. Cl.³ .......................... H03F 1/32; H03F 3/16
[52] U.S. Cl. ................................. 330/149; 330/277; 330/290; 330/296
[58] Field of Search ................ 330/149, 277, 290, 296

[56] References Cited

U.S. PATENT DOCUMENTS

| | | | |
|---|---|---|---|
| 3,755,754 | 8/1973 | Putz | 330/149 |
| 4,068,186 | 1/1978 | Sato et al. | 330/149 |
| 4,283,684 | 8/1981 | Satoh | 330/277 |
| 4,465,980 | 8/1984 | Huang et al. | 330/149 |

*Primary Examiner*—James B. Mullins
*Attorney, Agent, or Firm*—David R. Padnes

[57] ABSTRACT

Amplifier-produced distortion known as amplitude modulation to phase modulation (AM/PM) conversion is reduced through the use of GaAs FETs which are biased to generate AM/PM having an algebraic sign opposite to that generated by the amplifier. This algebraic sign reversal is accomplished by biasing the GaAs FETs so that a DC drain current $\leq 75\%$ and $\geq 10\%$ of the short-circuit drain current is established. In the disclosed embodiment, several GaAs FETs are cascaded in alternation with attenuators to increase the magnitude of the compensating AM/PM conversion without generating substantial amplitude modulation to amplitude modulation (AM/PM) conversion.

14 Claims, 2 Drawing Figures

DISTORTION COMPENSATION FOR A MICROWAVE AMPLIFIER

TECHNICAL FIELD

The present invention relates to distortion compensation for microwave amplifiers and, more particularly, to a technique which compensates for the amplitude modulation to phase modulation conversion generated by such amplifiers.

BACKGROUND OF THE INVENTION

Microwave amplifiers, such as solid-state power amplifiers and traveling wave tube amplifiers, are widely used in communication systems for transmitting analog or digital data. A chronic problem with these amplifiers is that they exhibit nonlinear amplitude and phase transfer characteristics. These distortions are primary impediments to the reliable, spectrally-efficient transmission of data.

For an amplifier input signal having a modulated amplitude, as in many present-day communications systems, the nonlinear distortion is categorized as amplitude modulation to amplitude modulation (AM/AM) conversion and amplitude modulation to phase modulation (AM/PM) conversion. AM/AM conversion relates to the amplitude relationship at the amplifier input and output and can be defined as the change in gain with respect to a change in the input or output signal power. AM/PM conversion, on the other hand, relates to the amplitude and phase characteristics of the amplifier and can be defined as the change in the output signal phase relative to a change in the input or output signal power.

AM/AM conversion is a function of the power handling capability of the amplifier and can generally be lessened by reducing the drive level of the amplifier so that the output power is consideraly below saturation. This commonly used technique is known as "amplifier back-off". Unfortunately, this technique often does not adequately eliminate the AM/PM conversion. Consequently, in many system applications, AM/PM conversion is the major portion of the nonlinear distortion generated by microwave amplifiers.

Many prior art techniques which compensate for the nonlinear distortion generated by microwave amplifiers (see, for example, U.S. Pat. No. 3,755,754 to Putz and 4,283,684 to Satoh) have relied on circuits comprising signal splitters, amplifiers, phase shifters and signal combiners to generate a distortion correction signal. This correction signal is then added to the microwave amplifier input signal. A shortcoming of this technique is that it is often times not amenable to integrated circuit techniques and, therefore, the circuit design cannot be integrated onto a solid-state power amplifier substrate. As a result, the distortion compensation generated may not accurately track changes in the amplifier transfer characteristic with changes in amplifier operating temperature. In addition, the prior art circuits can be complex and expensive to implement.

SUMMARY OF THE INVENTION

Distortion compensation circuitry in accordance with the present invention comprises one or more gallium arsenide (GaAs) field-effect transistors (FETs) which generate AM/PM conversion having an opposite algebraic sign to the AM/PM conversion generated by a microwave power amplifier. This algebraic sign reversal is achieved by establishing an average or DC component of the drain current which is less than 75% of the maximum or short-circuit drain current in each FET. In the disclosed embodiment, the distortion compensation circuitry comprises cascaded GaAs FETs which together produce AM/PM conversion substantially equal and opposite to the AM/PM conversion generated by a microwave power amplifier. Advantageously, attenuators can be disposed between the FETs to preclude saturation and the undesirable generation of AM/PM conversion.

A feature of the present invention is that it can be incorporated into a GaAs FET power amplifier and thereby provide distortion compensation which tracks changes in the power amplifier operating temperature.

DETAILED DESCRIPTION

Figure 1:
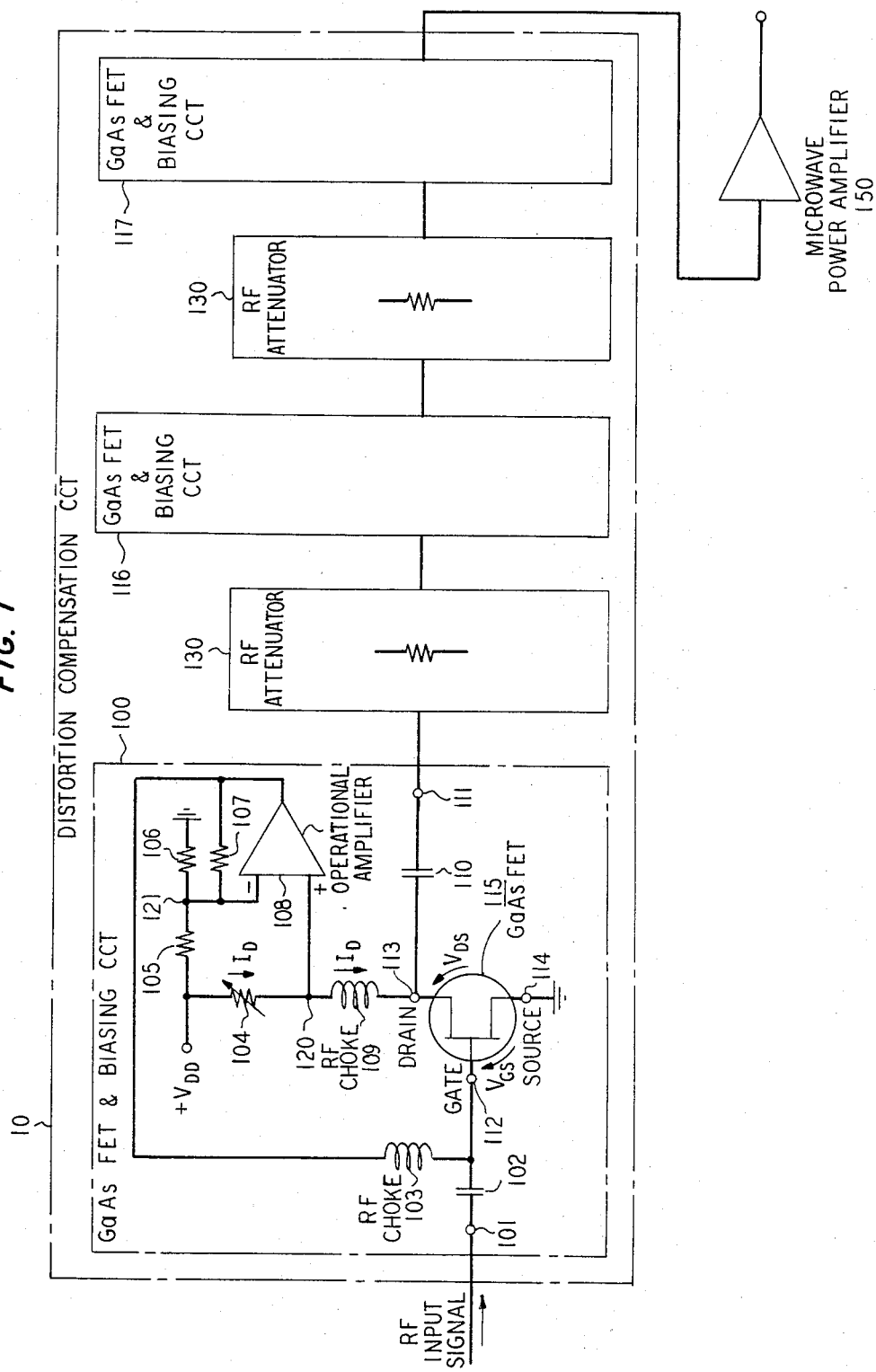
FIG. 1 is a block schematic diagram of the disclosed embodiment of the present invention.

As shown in FIG. 1, distortion compensation circuitry 10, comprising cascaded, substantially identical GaAS FET stages 100, 116 and 117, is disposed in the input signal path of GaAs FET microwave power amplifier 150. Such power amplifiers are typically disposed in the transmitters of microwave communications systems. The RF signal applied to input terminal 101 is a carrier signal which is amplitude-modulated at a modulation frequency of at least 100 Kilohertz. For purposes of illustration, amplifier 150 is a GaAs FET power amplifier which generates AM/PM conversion. That is, the RF signal at the output of amplifier 150 is shifted in phase relative to the RF signal at the input of amplifier 150 as a function of input or output power. Furthermore, this AM/PM conversion has an associated algebraic sign which depends on the direction of the phase shift of the amplifier output signal relative to the amplifier input signal. To reduce this AM/PM conversion, distortion compensation circuitry 10 generates AM/PM conversion in the input signal of amplifier 150 having an opposite algebraic sign to the AM/PM conversion generated by amplifier 150. This reversal of the algebraic sign is achieved by selection of the DC gate-source bias voltage, $V_{GS}$, which determines the DC drain current in the GaAs FETs in stages 100, 116 and 117. Concurrently, the DC drain-source bias voltage, $V_{DS}$, is held relatively constant in the saturated current region of the GaAs FETs' common-source I-V characteristics. Moreover, while circuitry 10 comprises stages 100, 116 and 117, the number of stages can be varied so that the magnitude of the AM/PM conversion provided by circuitry 10 is substantially equal to the AM/PM conversion generated by amplifier 150. Finally, when more than one GaAs FET stage is utilized, RF attenuators 130 are advantageously disposed between stages. Each RF attenuator reduces the drive level of the immediately succeeding GaAs FET to substantially eliminate the generation of AM/PM conversion by the distortion compensation circuit 10.

Figure 2:
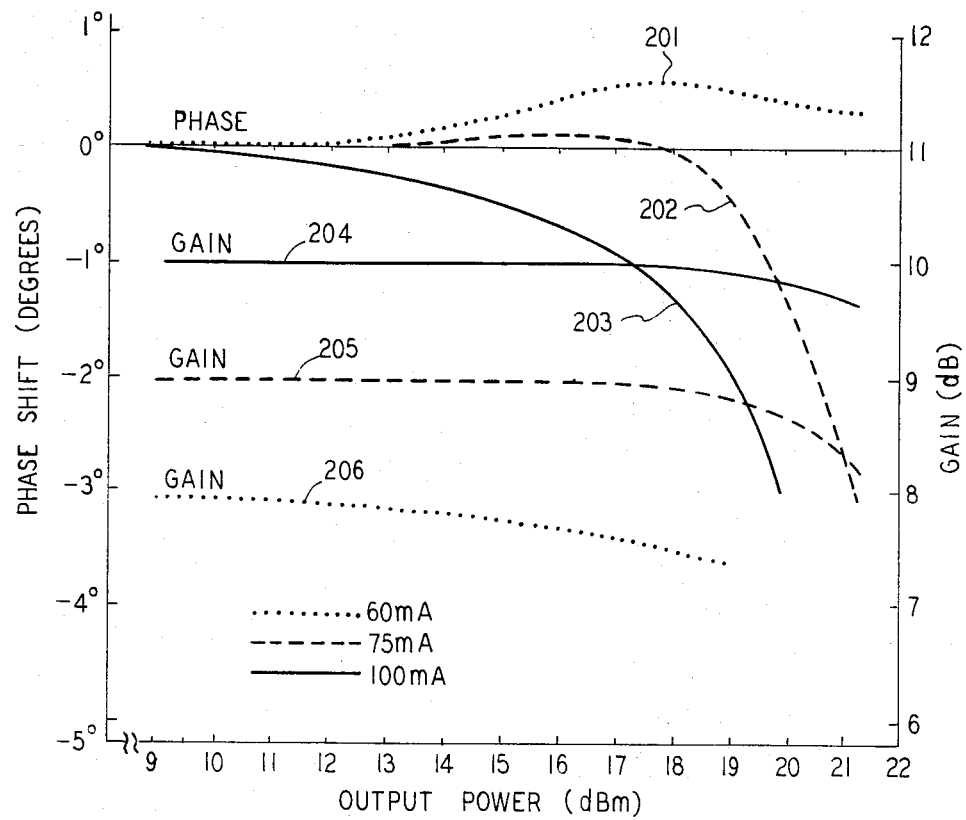
FIG. 2 is a set of curves which depicts the relationship between the drain current of a GaAs FET and AM/PM and AM/AM conversion.

To understand the relationship between the algebraic sign of the AM/PM conversion generated by a GaAs FET and the DC component of the drain current, refer now to FIG. 2. Curves 201, 202 and 203, respectively, show the phase shift in degrees of a GaAs FET output signal with respect to the input signal as a function of output signal power for DC drain currents of 60, 75 and 100 milliamperes (mA). The RF input signal used to generate these curves was a 6 GHz carrier which was amplitude-modulated ±1 dB about some average power level at a modulation frequency of 1 MHz. The maximum of short-circuit drain current of the GaAs FET was 100 mA and, therefore, curve 203 depicts the phase shift provided by a GaAs FET power amplifier, such as amplifier 150. It should be noted that regardless of the output power, the phase shift provided by the GaAs FET is in one direction and is expressed in units of negative degrees. In comparison, for a drain current of 60 mA, the phase shift provided for an output power greater than 12.5 dBm is in a direction opposite to that generated at 100 mA. This reversal in the algebraic sign of the phase shift relative to 100 mA is also true for a drain current of 75 mA when the output power level is between 12.5 and 18 dBm.

Curves 204, 205 and 206 show the variations in gain as a function of output signal power for 100, 75 and 60 mA, respectively. As these curves depict that a substantially constant gain exists for a range of output power levels, the GaAs FETs in amplifier 150 and those in circuitry 10 can be easily operated within these ranges of "flat" gain to minimize the generation of AM/AM conversion.

Refer back to FIG. 1. Distortion compensation circuitry 10 comprises several cascaded GaAs FETs each having an associated biasing circuit. Each FET 115 is biased for class A operation with the DC component of the drain current, $I_D$, selected to be $\geq 10\%$ and $\leq 75\%$ of the maximum or short-circuit drain current. The upper percentage limit assures that the AM/PM conversion generated by each FET is opposite in algebraic sign to the AM/PM conversion generated by power amplifier 150. The lower percentage limit assures that gain compression or AM/AM conversion is virtually nonexistent.

The source terminal 114 of each FET 115 is grounded. The DC voltages at drain terminal 113 and gate terminal 112 are provided from a reference voltage source $V_{DD}$ using biasing circuitry comprising adjustable resistor 104, operational amplifier 108 and resistors 105, 106 and 107. Variable resistor 104 is adjusted to set a preselected DC drain current, $I_D$, which is $\geq 10\%$ or $\leq 75\%$ of the maximum or short-circuit drain current of FET 115. This selection of $I_D$ also sets the voltage at the positive input terminal 120 of amplifier 108. Resistors 105 and 106 form a voltage divider which establishes a fixed voltage at the negative input terminal 121 of amplifier 108 which is greater than the voltage at terminal 120. Resistor 107 sets the gain of amplifier 108 so that gate terminal 112 of FET 115 is negatively biased.

Advantageously, the disclosed biasing circuitry automatically adjusts the DC bias voltage at the gate terminal to maintain the preselected value of $I_D$. For example, if $I_D$ decreases after adjustment of resistor 104 due to temperature or other effects, the bias voltage at gate terminal 112 becomes less negative to restore the preselected value of $I_D$. Similarly, the bias voltage at gate terminal 112 becomes more negative so as to decrease the value of $I_D$ if this current increases for any reason after the adjustment of resistor 104.

RF chokes 103 and 109 prevent the RF input signal from entering the bias circuitry. Capacitors 102 and 110, respectively, prevent the DC component of the gate and drain bais currents from being coupled to RF input terminal 101 and RF output terminal 111.

It should, of course, be understood that while the foregoing description describes the distortion compensation of a GaAs FET power amplifier, the present invention is equally applicable to other RF amplifiers, such as klystrons and traveling wave tube amplifiers. In addition, while circuitry 10 is disposed to predistort the RF signal to a power amplifier, circuitry 10 can be disposed at the output of an RF power amplifier to postdistort an RF signal so as to reduce AM/PM conversion. Therefore, if postdistortion is utilized, circuitry 10 can be located in either the transmitter or receiver of a microwave communications system.

What is claimed is:

1. Apparatus for use in a communication system wherein an amplifier generates distortion known as amplitude modulation to phase modulation conversion in an input signal, said apparatus comprising
   at least one GaAs field-effect transistor for receiving said signal, said transistor having gate, source and drain terminals; and
   means for biasing said terminals independently of said input signal so that said transistor generates amplitude modulation to phase modulation conversion in said signal, said conversion having an algebraic sign opposite to that generated in said signal by said amplifier.

2. The apparatus of claim 1 wherein each of said transistors has a short-circuit drain current and said biasing means establishes a DC drain current $\leq 75\%$ and $\geq 10\%$ of the short-circuit drain current.

3. The apparatus of claim 2 wherein said biasing means biases each of said transistors for class A operation.

4. The apparatus of claim 3 further including attenuators.

5. The apparatus of claim 4 wherein said attenuators are cascaded in alternation with said transistors.

6. The apparatus of claim 5 wherein each of said attenuators reduces the drive level of an immediately succeeding one of said transistors to minimize the generation of distortion known as amplitude modulation to amplitude modulation conversion.

7. A method of reducing distortion known as amplitude modulation to phase modulation conversion which is generated in a signal by an amplifier, said method comprising the steps of
   coupling said signal to at least one GaAs field-effect transistor having gate, source, and drain terminals; and
   biasing said terminals independently of said signal so that said transistor generates amplitude modulation to phase modulation conversion in said signal, said conversion having an algebraic sign opposite to that generated in said signal by said amplifier.

8. The method of claim 7 wherein each of said transistors has a short-circuit drain current and said biasing means establishes a DC drain current $\leq 75\%$ and $\geq 10\%$ of the short-circuit drain current.

9. The method of claim 8 wherein each of said transistors is biased for class A operation.

10. The method of claim 9 further including the step of coupling said signal through attenuators.

11. The method of claim 10 wherein said attenuators are cascaded in alternation with said transistors.

12. The method of claim 11 wherein each of said attenuators reduces the drive level of an immediately succeeding one of said transistors to minimize the generation of distortion known as amplitude modulation to amplitude modulation conversion.

13. Apparatus for use in a communication system wherein an amplifier generates distortion known as amplitude modulation to phase modulation conversion in an input signal, said apparatus comprising at least one single gate GaAs field-effect transistor for receiving said signal, said transistor having gate, source and drain terminals; and means for biasing said terminals so that said transistor generates amplitude modulation to phase modulation conversion in said signal, said conversion having an algebraic sign opposite to that generated in said signal by said amplifier.

14. A method of reducing distortion known as amplitude modulation to phase modulation conversion which is generated in a signal by an amplifier, said method comprising the steps of coupling said signal to at least one single gate GaAs field-effect transistor having gate, source and drain terminals; and biasing said terminals so that said transistor generates amplitude modulation to phase modulation conversion in said signal, said conversion having an algebraic sign opposite to that generated in said signal by said amplifier.

* * * * *